(12) United States Patent
Chen

(10) Patent No.: US 10,826,995 B2
(45) Date of Patent: Nov. 3, 2020

(54) ELECTRIC DEVICE MONITORING SYSTEM AND ELECTRIC DEVICE MONITORING METHOD

(71) Applicant: Ming-Tsung Chen, Taipei (TW)

(72) Inventor: Ming-Tsung Chen, Taipei (TW)

(*) Notice: Subject to any disclaimer, the term of this patent is extended or adjusted under 35 U.S.C. 154(b) by 154 days.

(21) Appl. No.: 16/236,214

(22) Filed: Dec. 28, 2018

(65) Prior Publication Data

US 2020/0213394 A1 Jul. 2, 2020

(51) Int. Cl.
| | |
|---|---|
| *G01R 31/14* | (2006.01) |
| *G01R 31/28* | (2006.01) |
| *H04L 29/08* | (2006.01) |
| *H04L 12/28* | (2006.01) |
| *H04L 29/06* | (2006.01) |
| *H04Q 9/00* | (2006.01) |
| *G01R 31/50* | (2020.01) |
| *G01R 31/52* | (2020.01) |
| *G01R 31/58* | (2020.01) |

(Continued)

(52) U.S. Cl.
CPC .......... *H04L 67/12* (2013.01); *G01R 31/2825* (2013.01); *G01R 31/2829* (2013.01); *G01R 31/343* (2013.01); *G01R 31/50* (2020.01); *G01R 31/52* (2020.01); *G01R 31/54* (2020.01); *G01R 31/58* (2020.01); *G01R 31/66* (2020.01); *H04L 12/2825* (2013.01); *H04L 69/18* (2013.01); *H04Q 9/00* (2013.01); *H04L 2012/285* (2013.01); *H04Q 2209/88* (2013.01)

(58) Field of Classification Search
CPC ........ G01R 31/50; G01R 31/52; G01R 31/58; G01R 31/343; G01R 31/2829; G01R 31/2825; G01R 31/54; G01R 31/66

USPC .................................................. 324/500, 511
See application file for complete search history.

(56) References Cited

U.S. PATENT DOCUMENTS

| | | | | |
|---|---|---|---|---|
| 2008/0158008 | A1* | 7/2008 | Kagan ................. | H04L 12/4633 340/870.05 |
| 2013/0204450 | A1* | 8/2013 | Kagan .................... | H04W 4/38 700/291 |

(Continued)

FOREIGN PATENT DOCUMENTS

| | | |
|---|---|---|
| CN | 106450960 A | 2/2017 |
| CN | 205920331 U | 2/2017 |

(Continued)

*Primary Examiner* — Raul J Rios Russo
(74) *Attorney, Agent, or Firm* — Li & Cai Intellectual Property (USA) Office

(57) ABSTRACT

An electronic device monitoring system includes a server, a first electronic device, and a first power feature identifying device. The first electronic device is electrically connected to a grid. A first voltage and a first current are variable. The first power feature identifying device communicates with the server by a first communication protocol. The first power feature identifying device is disposed between the first electronic device and the grid. The first power feature identifying device extracts a plurality of voltage-time features, a plurality of current-time features, and a plurality of voltage-current features of the first electronic device in a first predetermined time, and the first power feature identifying device transmits those features to the server to generate a first power profile based thereon. The server monitors whether the first electronic device is in normal operation based on the first power profile.

6 Claims, 4 Drawing Sheets

(51) Int. Cl.
    *G01R 31/34*     (2020.01)
    *G01R 31/54*     (2020.01)
    *G01R 31/66*     (2020.01)

(56) References Cited

U.S. PATENT DOCUMENTS

2018/0262046 A1    9/2018  Moon et al.
2019/0251641 A1*   8/2019  Kagan ................... G01D 4/004

FOREIGN PATENT DOCUMENTS

| | | |
|---|---|---|
| CN | 206353258 U | 7/2017 |
| JP | 2004222375 A | 8/2004 |
| JP | 2012189526 A | 10/2012 |
| JP | 201646965 A | 4/2016 |
| WO | 2014097458 A1 | 6/2014 |

* cited by examiner

ELECTRIC DEVICE MONITORING SYSTEM AND ELECTRIC DEVICE MONITORING METHOD

FIELD OF THE DISCLOSURE

The present disclosure relates to an electronic device monitoring system and an electronic system monitoring method, and more particularly to an electronic device monitoring system and an electronic system monitoring method that use power features for monitoring.

BACKGROUND OF THE DISCLOSURE

With increased use of electronic devices, it is getting harder to know the operating conditions of electronic devices. Especially, for home appliances which have been used for a long period of time by users, the users usually ignore the operating conditions of these home appliances. Even, many smart home appliances with IoT do not have self-testing function.

Therefore, it is an important issue in the industry to provide a monitoring system for monitoring the operation of an electronic device.

SUMMARY OF THE DISCLOSURE

In response to the above-referenced technical inadequacies, the present disclosure provides an electronic device monitoring system. The electronic device monitoring system includes: a server, a first electronic device, and a first power feature identifying device. The first electronic device is electrically connected to a grid. The grid provides a first voltage and a first current to the first electronic device. The first voltage and the first current are variable. The first power feature identifying device communicates with the server by a first communication protocol. The first power feature identifying device is disposed between the first electronic device and the grid. The first power feature identifying device extracts a plurality of voltage-time features, a plurality of current-time features, and a plurality of voltage-current features of the first electronic device in a first predetermined time. The first power feature identifying device transmits the plurality of voltage-time features, the plurality of current-time features, and the plurality of voltage-current features of the first electronic device to the server to generate a first power profile based on the plurality of voltage-time features, the plurality of current-time features, and the plurality of voltage-current features of the first electronic device. The server monitors whether the first electronic device is in normal operation based on the first power profile.

In certain embodiments, the present disclosure provides an electronic device monitoring method for monitoring a plurality of electronic devices disposed in a predetermined area. The electronic device monitoring method includes: extracting a plurality of voltage-time features, a plurality of current-time features, and a plurality of voltage-current features of a first electronic device and a second electronic device; transmitting the plurality of voltage-time features, the plurality of current-time features, and the plurality of voltage-current features of the first electronic device, and the plurality of voltage-time features, the plurality of current-time features, and the plurality of voltage-current features of the second electronic device to a server; generating a first power profile and a second power profile based on the plurality of voltage-time features, the plurality of current-time features, and the plurality of voltage-current features of the first electronic device, and the plurality of voltage-time features, the plurality of current-time features, and the plurality of voltage-current features of the second electronic device; and monitoring whether the first electronic device and the second electronic device are in normal operation based on the first power profile and the second power profile.

Therefore, the present disclosure utilizes the power feature identifying device to extract the power profile of each of the electronic devices, and monitors whether each electronic device has problems in operation based on the power profile of each electronic device. The cost of manual monitoring and the cost of electrical maintenance can be effectively reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
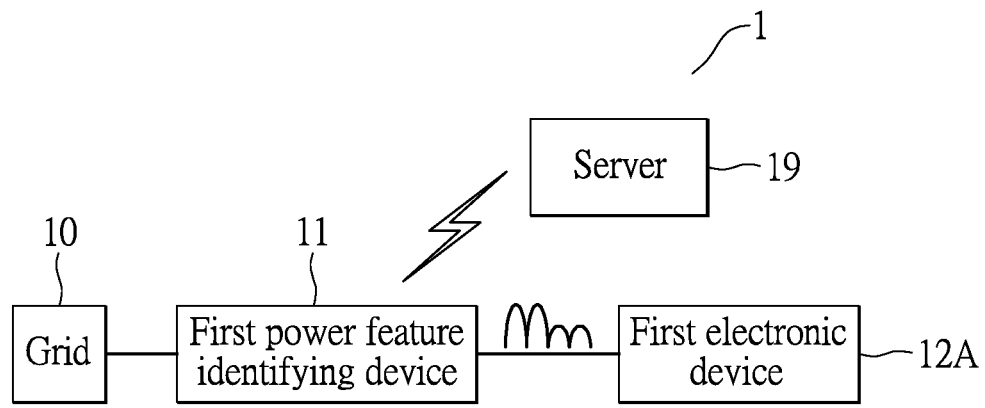
FIG. 1 is a schematic diagram of an electronic device monitoring system in accordance with an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic diagram of an electronic device monitoring system in accordance with a first embodiment of the present disclosure.

In the embodiment, an electronic device monitoring system 1 includes a first power feature identifying device 11, a first electronic device 12A, and a server 19.

The first electronic device 12A is electrically connected to a grid 10. The grid 10 provides a first voltage and a first current to the first electronic device 12A. The first voltage and the first current are variable. The first voltage and the first current are an alternating current voltage and an alternating current, respectively. Since the voltage and current of the first electronic device 12A are not fixed, and the first voltage and the first current are changed due to loading variation or mode modulation, the first voltage and the first current are variable. In the embodiment, the grid 10 provides an alternating voltage to the first electronic device 12A.

The first power feature identifying device 11 is disposed between the first electronic device 12A and the grid 10. In other words, the first electric feature identifying device 11 is provided at a terminal of a power cable of the first electronic device 12A, wherein the first electronic device 12A uses the power cable to receive power.

The first power feature identifying device 11 extracts a plurality of voltage-time features, a plurality of current-time features, and a plurality of voltage-current features of the first electronic device 12A in a first predetermined time. In other words, the first power feature identifying device 11 extracts all voltage features and current features within the first predetermined time after the first electronic device 12A is connected to the grid, and the first predetermined time may be, for example, 10 minutes or 20 minutes. In the embodiment, the first predetermined time may be different based on the difference of the electronic devices, which is not limited in the present disclosure.

Furthermore, the first power feature identifying device 11 communicates with the server 19 by the first communication protocol. In other words, the first power feature identifying device 11 transmits a plurality of voltage-time features, a plurality of current-time features, and a plurality of voltage-current features of the first electronic device 12A to the server 19.

In the embodiment, the voltage time features, the current time feature, and the voltage current feature value include a maximum voltage, a minimum voltage, an average voltage, a maximum current, a minimum current, and an average current, the number of surges, a voltage variation and a current variation under different loads, voltage and current changes during load switching. In the present disclosure, the power features of the electronic device can be adjusted and designed based on actual requirements, which is not limited in the present disclosure.

The server 19 generates a first power profile based on the plurality of voltage-time features, the plurality of current-time features, and the plurality of voltage-current features of the first electronic device 12A. In the embodiment, the first power profile can be represented by a graphic or a set of numerical values, which also represents various parameters of the first electronic device 12A in normal operation.

The server 19 monitors whether the first electronic device 12A is in normal operation based on the first power profile.

Since the first power feature identifying device 11 continuously extracts and records the power features of the first electronic device 12A, and continuously transmits the recorded/extracted power features of the first electronic device 12A to the server 19. The server 19 checks whether the power features of the first electronic device 12A are different at different time points. If there is a significant difference, the server 19 provides an exception report of the first electronic device 12A to the user through a network to inform the user that the first electronic device 12A has malfunctioned.

In the embodiment, the number of the electrical feature identifying device can be adjusted based on actual requirements, which is not limited in the present disclosure. The number of electronic device can also be adjusted based on actual requirements, and not limited in the present disclosure.

In the embodiment, the first electronic device 12A may include a refrigerator, a television, a washing machine, a hair dryer, a charger, a notebook computer, a desktop computer, an LED light fixture. In other words, the first electronic device 12A is not limited to any type of electronic device in the present disclosure.

Figure 2:
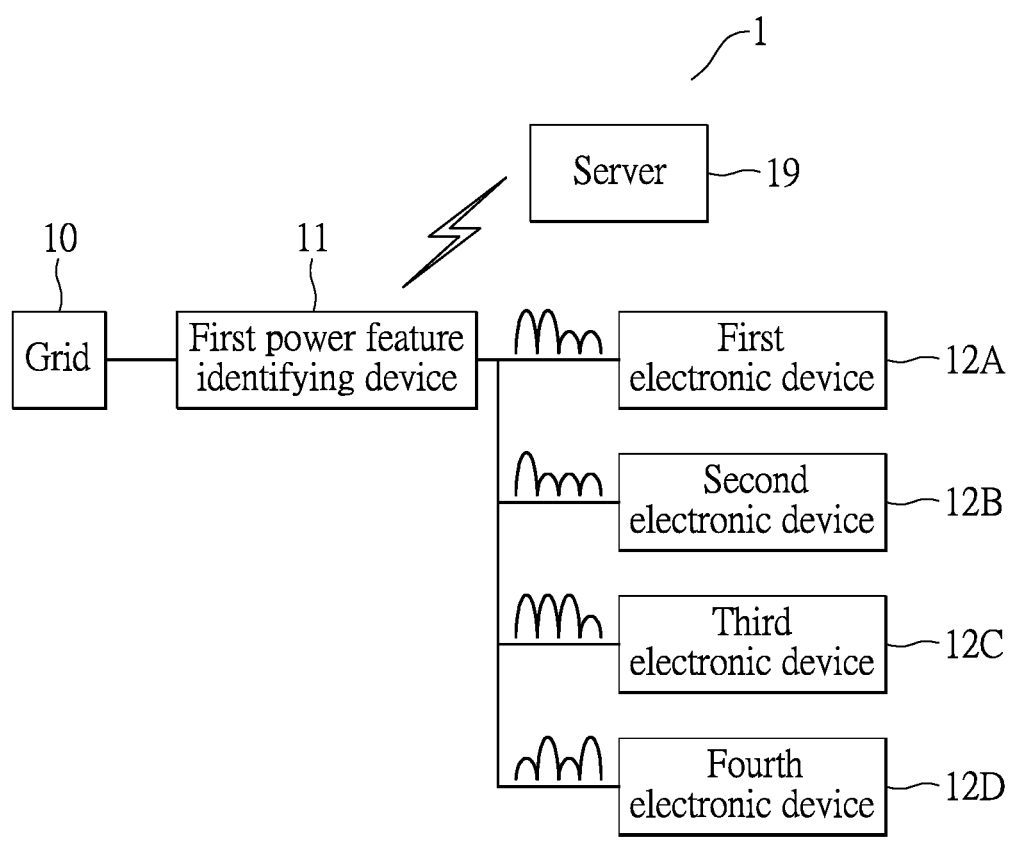
FIG. 2 is a schematic diagram of an electronic device monitoring system in accordance with a first embodiment of the present disclosure.

Referring to FIG. 2, FIG. 2 is another schematic diagram of the electronic device monitoring system in accordance with the first embodiment of the present disclosure.

In FIG. 2, aside from the first electronic device 12A, the electronic device monitoring system 1 further includes a second electronic device 12B, a third electronic device 12C, and a fourth electronic device 12D. The second electronic device 12B, the third electronic device 12C, and the fourth electronic device 12D are electrically connected to the grid 10 through the first power feature identifying device 11.

In the embodiment, the first power feature identifying device 11 can capture the power feature value of the first electronic device 12A, and also can extract the power features of the second electronic device 12B.

In other words, the first power feature identifying device 11 can extract a plurality of voltage-time features, a plurality of current-time features, and a plurality of voltage-current features of the second electronic device 12B in a second predetermined time, and a plurality of voltage-time features, a plurality of current-time features, and a plurality of voltage-current features of the third electronic device 12C in a third predetermined time, and a plurality of voltage-time features, a plurality of current-time features, and a plurality of voltage-current features of the fourth electronic device 12D in a fourth predetermined time.

The first power feature identifying device 11 also transmits a plurality of voltage-time features, a plurality of current-time features, and a plurality of voltage-current features of the second electronic device 12B, the third electronic device 12C, and the fourth electronic device 12D to the server 19.

The server 19 generates a second power profile based on the plurality of voltage-time features, the plurality of current-time features, and the plurality of voltage-current features of the second electronic device 12B.

Then, the server 19 generates a third power profile and the fourth power profile based on the plurality of voltage-time features, the plurality of current-time features, and the plurality of voltage-current features of the third electronic device 12C and the fourth electronic device 12D, respectively.

In the embodiment, the first power profile, the second power profile, the third power profile, and the fourth power profile may be represented by a graphic or a set of numerical values, and also represent the parameters of each of the first electronic device 12A, the second electronic device 12B, the third electronic device 12C, and the fourth electronic device 12D during normal operation.

In the embodiment, the server 19 converts the features of the first electronic device 12A to a voltage-frequency spectrum, a current-frequency spectrum, or a multi-factor voltage-current-frequency spectrum, which can be adjusted and designed based on actual requirements, and not be limited in the present disclosure.

In the embodiment, the first power profile, the second power profile, the third power profile, and the fourth power profile may also be generated based on a plurality of voltage-frequency features of the voltage-frequency spectrum, a plurality of current-frequency features of the current-frequency spectrum, a plurality of voltage-current-frequency features of the voltage-current-frequency spectrum.

In other words, the first power profile, the second power profile, the third power profile, and the fourth power profile may be determined based on the plurality of voltage-time features, the plurality of current-time features, the plurality of voltage-current features, the plurality of voltage-frequency features, the plurality of current-frequency features, and the plurality of voltages of voltage-current-frequency features of the first electronic device 12A, the second electronic device 12B, the three electronic devices 12C and the fourth electronic device 12D.

In other embodiment, the first power profile, the second power profile, the third power profile, and the fourth power profile are determined based on one of the plurality of voltage-time features, the plurality of current-time features, the plurality of voltage-current features, the plurality of voltage-frequency features, the plurality of current-frequency features, and the plurality of voltages of voltage-current-frequency features or a combination thereof, which is not limited in the present disclosure.

The server 19 monitors whether the first electronic device 12A, the second electronic device 12B, the third electronic device 12C and the fourth electronic device 12D is in normal operation based on the first power profile, the second power profile, the third power profile, and the fourth power profile.

The first power feature identifying device 11 continuously records and extracts the power feature values of the first electronic device 12A, the second electronic device 12B, the third electronic device 12C, and the fourth electronic device 12D, and continuously transmits the recorded and extracted power feature values of the first electronic device 12A, the second electronic device 12B, the third electronic device 12C, and the fourth electronic device 12D to the server 19. Therefore, the server 19 can continuously check whether the power features of the first electronic device 12A, the second electronic device 12B, the third electronic device 12C, and the fourth electronic device 12D are different at different time points. If there is a significant difference, the server 19 can provide an exception report of the first electronic device 12A, the second electronic device 12B, the third electronic device 12C, or the fourth electronic device 12D to the user through the network to notify the user that the first electronic device 12A, the second electronic device 12B, the third electronic device 12C, or the fourth electronic device 12D has malfunctioned.

Second Embodiment

Figure 3:
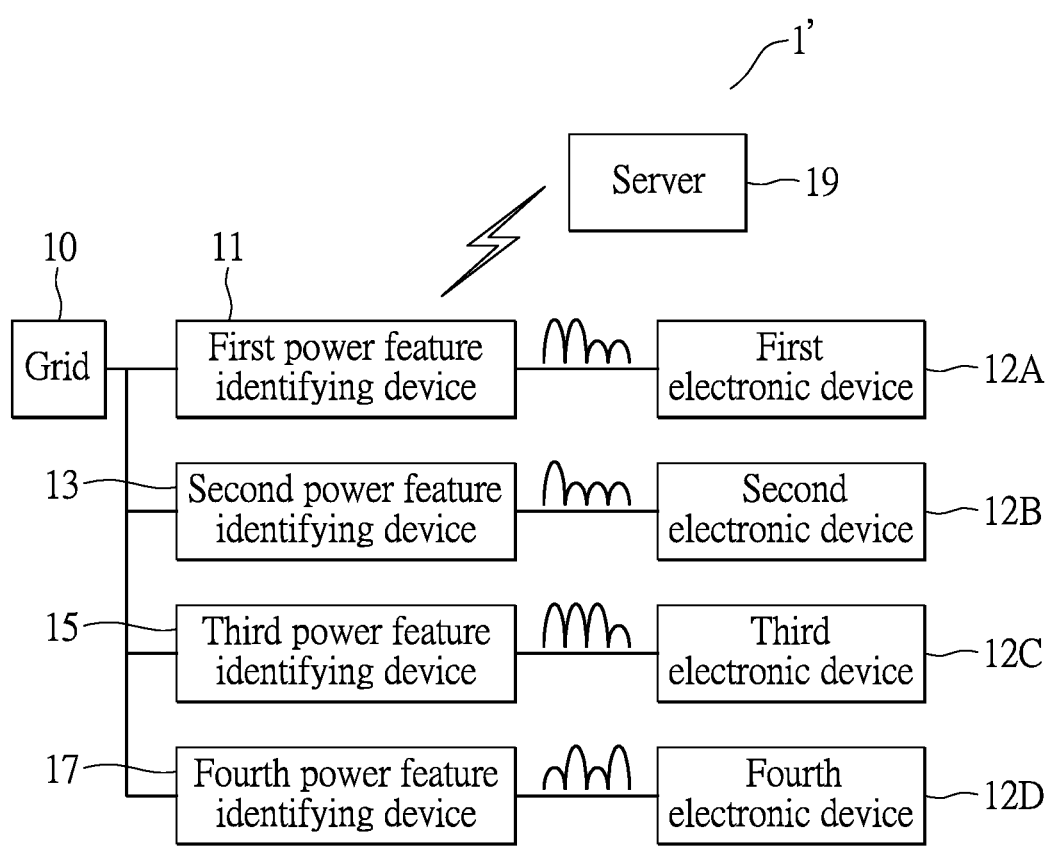
FIG. 3 is a schematic diagram of the electronic device monitoring system in accordance with a second embodiment of the present disclosure.

Referring to FIG. 3, FIG. 3 is a schematic diagram of an electronic device monitoring system in accordance with the second embodiment of the present disclosure.

In the embodiment, an electronic device monitoring system 1' includes the first power feature identifying device 11, a second power feature identifying device 13, a third power feature identifying device 15, and a fourth power feature identifying device 17, the first electronic device 12A, the second electronic device 12B, the third electronic device 12C, and the fourth electronic device 12D.

The first electronic device 12A, the second electronic device 12B, the third electronic device 12C, and the fourth electronic device 12D are respectively connected to the grid 10 through the first power feature identifying device 11, the second power feature identifying device 13, and the third power feature identifying device 15 and the fourth electrical feature identifying device 17.

In the embodiment, the first power feature identifying device 11, the second power feature identifying device 13, the third power feature identifying device 15, and the fourth power feature identifying device 17 respectively communicates with the server 19 through the first communication protocol, a second communication protocol, a third communication protocol, and a fourth communication protocol. The first communication protocol, the second communication protocol, the third communication protocol, and the fourth communication protocol may be the same communication protocol or different communication protocols, which are not limited in the present disclosure. In the embodiment, the first communication protocol, the second communication protocol, the third communication protocol, and the fourth communication protocol respectively include a Bluetooth communication protocol, a Zigbee communication protocol, a LoRa communication protocol, and a Sigfox communication protocol, a wireless fidelity communication protocol (WiFi), a fourth-generation mobile communication technology communication protocol (4G), a fifth-generation mobile communication technology communication protocol (5G), which can be adjusted based on actual requirements in the present disclosure, and not limited in the present disclosure.

In the embodiment, the plurality of power feature identifying devices respectively extract a plurality of voltage-time features, a plurality of current-time features, and a plurality of voltage-current features corresponding to the electronic devices in respective predetermined times, and transmit those features to the server 19. Then, the server 19 generates the first power profile, the second power profile, the third power profile, and the fourth power profile, and determines whether the electronic devices are in normal operation based on the plurality of power profiles.

Figure 4A:
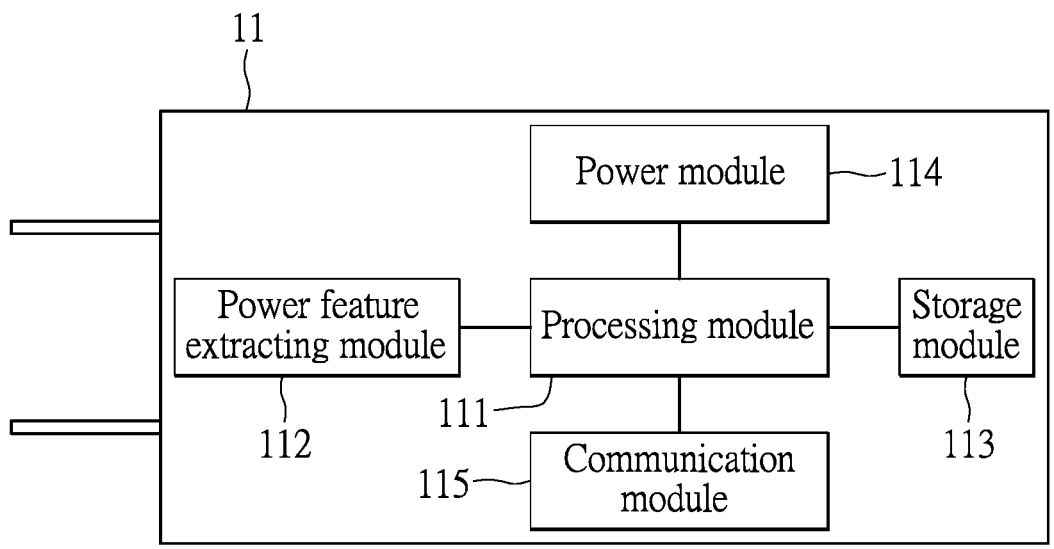
FIG. 4A is a schematic diagram of a first power feature identifying device in accordance with the second embodiment of the present disclosure.
Figure 4B:
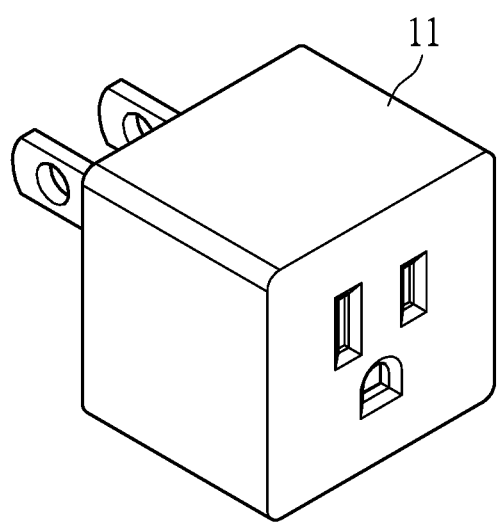
FIG. 4B is another schematic diagram of the first power feature identifying device in accordance with the second embodiment of the present disclosure.

Referring to FIGS. 4A and 4B, FIG. 4A is a schematic diagram of a first power feature identifying device based on the second embodiment of the present disclosure. FIG. 4B is another schematic diagram of the first power feature identifying device in accordance with the second embodiment of the present disclosure. The first power feature identifying device 11 is taken as an example in the following descriptions. The structure and function of the other power feature identifying devices are the same as those of the first power feature identifying device 11, and are not described herein.

In the embodiment, the first power feature identifying device 11 includes a processing module 111, a power feature extracting module 112, a storage module 113, a power module 114, and a communication module 115.

The processing module 111 is electrically connected to the power feature extracting module 112, the storage module 113, the power module 114, and the communication module 115.

The power feature extracting module 112 is electrically connected to the processing module 111 for extracting a plurality of voltage-time features, a plurality of current-time features, and a plurality of voltages of one or more electronic device(s) connected to the first power feature identifying module 11.

The power module 114 converts an external voltage to an internal voltage, and provides the internal voltage to the processing module 111, the storage module 113, and the power feature extracting module 112.

The processing module 111 provides the plurality of voltage-time features, the plurality of current-time features, and the plurality of voltage-current features of the one or more electronic devices connected to the first power feature identifying module 11 to the server 19 through the communication module 115.

In the embodiment, as shown in FIG. 4B, the first feature identifying device 11 is a pluggable socket unit. In other embodiment, the first feature identifying device 11 can be designed in other types, for example, a control switch disposed in the main switch of the power circuit, which can be adjusted and designed based on actual requirement, and not limited in the present disclosure.

Third Embodiment

Figure 5:
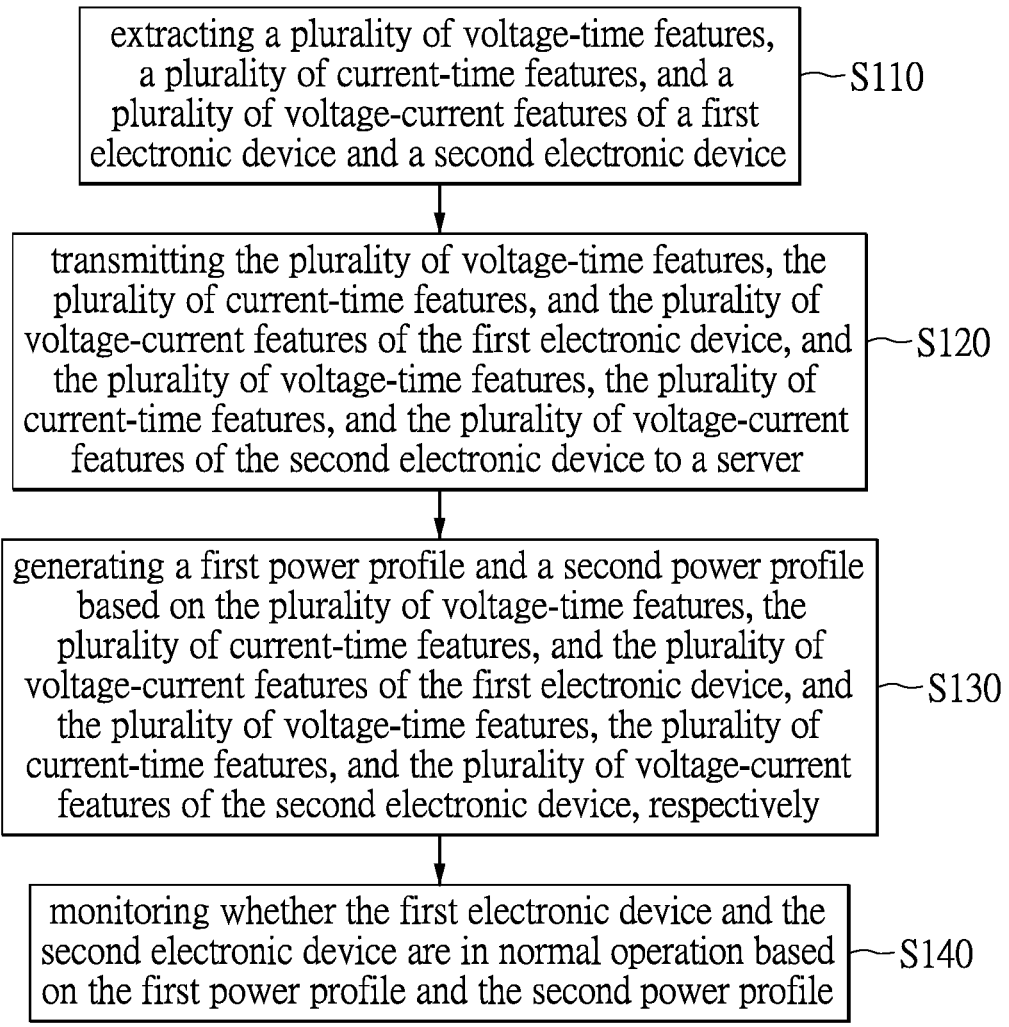
FIG. 5 is a flowchart of a method for monitoring an electronic device in accordance with a third embodiment of the present disclosure.

Referring to FIG. 5, FIG. 5 is a flowchart of a method for monitoring an electronic device in accordance with a third embodiment of the present disclosure.

The electronic device monitoring method in the embodiment is adapted to the electronic device monitoring system described above. Therefore, the structure and function of the related device described above are not described in the embodiment. In addition, the electronic device monitoring method of the present embodiment is adapted to monitor a plurality of electronic devices disposed in a predetermined area (not shown). In other words, the electronic devices are disposed in a predetermined area having the same power circuit.

In the embodiment, the electronic device monitoring method includes the following steps:

extracting a plurality of voltage-time features, a plurality of current-time features, and a plurality of voltage-current features of a first electronic device and a second electronic device (step S110);

transmitting the plurality of voltage-time features, the plurality of current-time features, and the plurality of voltage-current features of the first electronic device, and the plurality of voltage-time features, the plurality of current-time features, and the plurality of voltage-current features of the second electronic device to a server (step S120);

generating a first power profile and a second power profile based on the plurality of voltage-time features, the plurality of current-time features, and the plurality of voltage-current features of the first electronic device, and the plurality of voltage-time features, the plurality of current-time features, and the plurality of voltage-current features of the second electronic device, respectively (step S130); and monitoring whether the first electronic device and the second electronic device are in normal operation based on the first power profile and the second power profile (Step S140).

In step S110, the first electrical feature identifying device 11 is used for extracting a plurality of voltage-time features, a plurality of current-time features, and a plurality of voltage current features of the first electronic device and the second electronic device, or the first power feature identifying device 11 and the second power feature identifying device 13 are respectively used for extracting a plurality of voltage-time features and a plurality of current-time features, and a plurality of voltage-current features of the first electronic device and the second electronic device.

In step S120, when the first power feature identifying device 11 is used for extracting the plurality of voltage-time features, the plurality of current-time features, and the plurality of voltage-current features of the first electronic device and the second electronic device, the first power feature identifying device 11 communicates with the server 19 by a first communication protocol.

When the first power feature identifying device 11 and the second power feature identifying device 13 are used for extracting the plurality of voltage-time features, the plurality of current-time features, and the plurality of voltage-current features of the first electronic device and the second electronic device, the first power feature identifying device 11 and the second power feature identifying device 13 respectively communicate with the server 19 through the first communication protocol and the second communication protocol.

In step S130, the server 19 generates the first power profile and the second power profile based on the plurality of voltage-time features, the plurality of current-time features, and the plurality of voltage-current features of the first electronic device and the second electronic device, and establishes a power profile database accordingly. The first power profile and the second power profile are stored in the power profile database.

In step S140, since the power feature identifying device continuously records and extracts the power features of the first electronic device 12A and the second electronic device 12B. The extracted/recorded power features of the first electronic device 12A the second electronic device 12B are also continuously transmitted to the server 19. The server 19 continuously checks whether the first electronic device 12A and the second electronic device 12B have different power features at different time points. If there is a significant difference, the server 19 provides an exception report of the first electronic device 12A and the second electronic device 12B through the network to notify the user that the first electronic device 12A and the second electronic device 12B have malfunctioned. In other words, the server 19 continuously compares the received power features of the first electronic device 12A and the second electronic device 12B, and the power profiles of the first electronic device 12A and the second electronic device 12B stored in the power profile database to generate a comparing result to notify the user.

In addition, the power profile database further stores names and models of electronic devices corresponding to the first electronic device 12A and the second electronic device 12B.

In conclusion, the present disclosure utilizes the power feature identifying device to extract the power profile of each of the electronic devices, and monitors whether each electronic device has problems in operation based on the power profile of each electronic device. The cost of manual monitoring and the cost of electrical maintenance can be effectively reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electronic device monitoring system comprising:
   a server;
   a first electronic device being electrically connected to a grid, the grid providing a first voltage and a first current to the first electronic device, wherein the first voltage and the first current are variable; and
   a first power feature identifying device communicating with the server by a first communication protocol, the first power feature identifying device disposed between the first electronic device and the grid, the first power feature identifying device extracting a plurality of voltage-time features, a plurality of current-time features, and a plurality of voltage-current features of the first electronic device in a first predetermined time;
   wherein the first power feature identifying device transmits the plurality of voltage-time features, the plurality of current-time features, and the plurality of voltage-current features of the first electronic device to the server to generate a first power profile based on the plurality of voltage-time features, the plurality of current-time features, and the plurality of voltage-current features of the first electronic device;
   wherein the server monitors whether the first electronic device is in normal operation based on the first power profile.

2. The electronic device monitoring system of claim 1 further comprising:
   a second electronic device being electrically connected to the grid through the first power feature identifying device;
   wherein the first power feature identifying device extracts a plurality of voltage-time features, a plurality of current-time features, and a plurality of voltage-current features of the second electronic device in a second predetermined time;
   wherein the first power feature identifying device transmits the plurality of voltage-time features, the plurality of current-time features, and the plurality of voltage-current features of the second electronic device to the server to generate a second power profile based on the plurality of voltage-time features, the plurality of current-time features, and the plurality of voltage-current features of the second electronic device;
   wherein the server monitors whether the second electronic device is in normal operation based on the second power profile.

3. The electronic device monitoring system of claim 1 further comprising:
   a second electronic device being electrically connected to the grid through the first power feature identification device; and
   a second power feature identifying device communicating with the server by a second communication protocol, the second power feature identifying device disposed between the second electronic device and the grid, the second power feature identifying device extracting a plurality of voltage-time features, a plurality of current-time features, and a plurality of voltage-current features of the second electronic device in a second predetermined time;
   wherein the second power feature identifying device transmits the plurality of voltage-time features, the plurality of current-time features, and the plurality of voltage-current features of the second electronic device to the server to generate a second power profile based on the plurality of voltage-time features, the plurality of current-time features, and the plurality of voltage-current features of the second electronic device;
   wherein the server monitors whether the second electronic device is in normal operation based on the second power profile.

4. The electronic device monitoring system of claim 1, wherein the first power feature identifying device includes:
   a processing module;
   a storage module being electrically connected to the processing module;
   a communicating module being electrically connected to the processing module;
   a power feature extracting module electrically connected to the processing module for extracting a plurality of voltage-time feature values, a plurality of current-time features, and a plurality of voltage-current feature values of the first electronic device; and
   a power module being electrically connected to the processing module for converting an external voltage to an internal voltage, and providing the internal voltage to the processing module, the storage module, and the power feature extracting module;
   wherein the processing module provides the plurality of voltage-time features, the plurality of current-time features, and the plurality of voltage-current features of the first electronic device to the server through the communication module.

5. An electronic device monitoring method for monitoring a plurality of electronic devices disposed in a predetermined area, the electronic device monitoring method comprising:
   extracting a plurality of voltage-time features, a plurality of current-time features, and a plurality of voltage-current features of a first electronic device and a second electronic device;
   transmitting the plurality of voltage-time features, the plurality of current-time features, and the plurality of voltage-current features of the first electronic device, and the plurality of voltage-time features, the plurality of current-time features, and the plurality of voltage-current features of the second electronic device to a server;
   generating a first power profile and a second power profile based on the plurality of voltage-time features, the plurality of current-time features, and the plurality of voltage-current features of the first electronic device, and the plurality of voltage-time features, the plurality of current-time features, and the plurality of voltage-current features of the second electronic device; and monitoring whether the first electronic device and the second electronic device are in normal operation based on the first power profile and the second power profile.

6. The electronic device monitoring method of claim 5, wherein the first electronic device is electrically connected to the grid, the grid provides the first electronic device with a first voltage and a first current, the first voltage and the first current are variable;

wherein the first power feature identifying device communicating with the server by a first communication protocol, and the first power feature identifying device is disposed between the first electronic device and the grid, the first power feature identifying device extracts a plurality of voltage-time features, a plurality of current-time features, and a plurality of voltage-current features of the first electronic device in a first predetermined time; and wherein the first power feature identifying device transmits the plurality of voltage-time features, the plurality of current-time features, and the plurality of voltage-current features of the first electronic device to the server, a first power profile is generated based on the plurality of voltage-time features, the plurality of current-time features, and the plurality of voltage-current features of the first electronic device.

* * * * *